United States Patent [19]

Sakaguchi et al.

[11] Patent Number: 5,258,322
[45] Date of Patent: Nov. 2, 1993

[54] METHOD OF PRODUCING SEMICONDUCTOR SUBSTRATE

[75] Inventors: Kiyofumi Sakaguchi; Takao Yonehara, both of Atsugi, Japan

[73] Assignee: Canon Kabushiki Kaisha, Tokyo, Japan

[21] Appl. No.: 820,371

[22] Filed: Jan. 14, 1992

[30] Foreign Application Priority Data

Jan. 16, 1991 [JP] Japan ................................. 3-3253

[51] Int. Cl.$^5$ ........................................... H01L 21/76
[52] U.S. Cl. ...................................... 437/62; 437/71; 437/966; 148/DIG. 116
[58] Field of Search ........................... 437/62, 71, 966; 148/DIG. 85, DIG. 86, DIG. 116

[56] References Cited

U.S. PATENT DOCUMENTS 5,098,850  3/1992  Nishida et al. ........................... 437/4

FOREIGN PATENT DOCUMENTS 0449589  3/1991  European Pat. Off. .
56-110247  9/1981  Japan ................................. 437/71
58-25245  2/1983  Japan ................................. 437/71
59-144149  8/1984  Japan ................................. 437/71

OTHER PUBLICATIONS

Wolf, S. et al, *Silicon Processing for the VLSI Era, vol. 1: Process Technology* (1986) pp. 216–218.
Wolf, S., *Silicon Processing for the VLSI Era, vol. 2: Process Integration* (1990) pp. 76–77.
Imai, et al., "Crystalline Quality of Silicon Layer Formed By Technology." Journal of Crystal Growth 63 (1983) 547–553.
Uhlir, "Electrolytic Shaping of Germanium and Silicon." The Bell System Technical Journal, vol. XXXV, 1956, pp. 333–347.
Unigami, "Formation of Mechanism of Porous Silicon Layer by Anodization in HF Solution." Jour. of the Electrochemical Soc. vol. 127, No. 2, Feb. 1980, pp. 476–482.
Imai, "A New Dielectric Isolation Method Using Porous Silicon." Solid-State Electronics, vol. 24, No. 2, Feb. 1981, pp. 159–164.
Holstrom and Chi, "Complete Dielectric Isolation by Highly Selective and Self-Stopping Formation of Oxidized Porous Silicon." Appl. Phys. Lett., vol. 42, No. 4, Feb. 13, 1983, pp. 386–388.
Takai and Itoh, "Porous Silicon Layers and its Oxide for the Silicon-on-Insulator Structure." Appl. Phys. Lett. Jul. 1, 1986, pp. 222–225.
Tsubouchi et al., "Oxidation of Silicon in High-Pressure Steam." Japanese Journal of Applied Physics, vol. 16, No. 5, May 1977, pp. 855–856.
"Single-Crystal Silicon On Non-Single-Crystal Insulators," edited by G. W. Cullen, *Journal of Crystal Growth*, vol. 63, No. 1, Oct. 1, 1983, pp. 429–590.

*Primary Examiner*—George Fourson
*Attorney, Agent, or Firm*—Fitzpatrick, Cella, Harper & Scinto

[57] ABSTRACT

A method of producing a semiconductor substrate, which comprises forming a monocrystalline silicon layer on a porous silicon substrate by epitaxial growth and applying an oxidation treatment to the porous silicon substrate and the monocrystalline silicon layer at least near the interface between the porous silicon substrate and the monocrystalline silicon layer.

11 Claims, 3 Drawing Sheets

METHOD OF PRODUCING SEMICONDUCTOR SUBSTRATE

BACKGROUND OF THE INVENTION

1. Field of the Invention

The present invention relates to a method of producing a semiconductor substrate, and particularly to a method of producing a semiconductor substrate which is dielectrically separated or formed in a monocrystalline semiconductor layer on an insulator so as to be suitable for electronic devices and integrated circuits.

2. Related Background Art

Formation of a monocrystalline semiconductor layer on an insulator is widely known as "silicon on insulator (SOI) technique" and is investigated in various fields because devices formed by employing the SOI process have many advantages which cannot be attained by general bulk Si substrates used for forming Si integrated circuits. Namely, the use of the SOI technique permits the attainment of the following advantages:

1. It is easy to perform dielectric separation and possible to perform high integration.
2. The radiation resistance is excellent.
3. It is possible to reduce the floating capacity and increase the operating speed.
4. It is possible to omit the well process.
5. It is possible to prevent latching-up.
6. It is possible to form a fully depletion-type field effect transistor by reducing the thickness.

Methods of forming SOI structures have been investigated for several decades with a view to realizing the above-described characteristic advantages of these devices. The contents of the investigation are summarized in, for example, the following document: Special Issue: "Single-crystal silicon on non-single-crystal insulators"; edited by G. W. Cullen, Journal of Crystal Growth, volume 63, no 3, pp. 429–590 (1983).

The SOS (silicon on sapphire) technique for heteroepitaxy of a Si layer on a monocrystalline sapphire substrate by CVD (chemical vapor deposition) has also been known for a long time. Although the SOS technique is successfully achieved as the most mature SOI technique for the present, the SOS technique has the problems that large quantities of crystal defects occur due to the lattice non-conformity at the interface between the Si layer formed and the ground sapphire substrate and that aluminum is mixed in the Si layer from the sapphire substrate. First of all, the high price of the substrate and the retardation in increase in the area inhibit the widening of the application of the SOS technique.

In relatively recent years, attempts have been made to realize a SOI structure without using a sapphire substrate. Such attempts are roughly divided into the following two types:

1. After the surface of a Si monocrystalline substrate has been oxidized, a window (opening) is formed in the oxide surface to partially expose the Si substrate, and a Si monocrystalline layer is formed on $SiO_2$ by lateral epitaxial growth using as a seed the window (in this case, the Si layer is deposited on $SiO_2$).
2. A Si monocrystalline substrate is used as an active layer so that $SiO_2$ is formed below the substrate (in this case, no Si layer is deposited on $SiO_2$).

Known means for realizing the above method 1 include a method of epitaxially growing a Si monocrystalline layer in the lateral direction directly by the CVD process, a method of depositing amorphous Si and then epitaxially growing a solid phase in the lateral direction, a method of applying a convergent energy beam such as an electron beam, a laser or the like to an amorphous or polycrystalline Si layer to grow a monocrystalline layer on $SiO_2$ by melting recrystallization, and a method of scanning a zone melt region by using a rod-shaped heater (zone melting recrystallization). Although these methods have advantages and disadvantages, they have not been yet put into practical use in the industrial field because they may have problems with respect to controllability, productivity, uniformity and quality. For example, the CVD process requires sacrificial oxidation for forming a flat thin film. The solid growth method produces a crystal having defective crystallinity. The beam annealing method using an energy beam has the problems with respect to the processing time required for scanning by using a convergent beam and controllability of the degree of overlap of beams, focusing and so on. Although the zone melting recrystallization method among the above methods is most mature, and a relatively large scale integrated circuit can be experimentally formed by this method, many crystal defects such as sub-grains and the like still remain, and no minority carrier device can be formed by this method. Any one of these methods requires a Si substrate and thus cannot form a monocrystalline Si of high quality on a transparent amorphous insulating substrate such as a glass substrate.

The above method 2 in which a Si substrate is not used as a seed for epitaxial growth includes the following four methods:

1. An oxide film is formed on a Si monocrystalline substrate having a surface with V-shaped grooves formed therein by anisotropic etching, a polycrystalline Si layer is deposited on the oxide film so that the thickness is substantially the same as that of the Si substrate, and a Si monocrystalline region surrounded by the V-shaped grooves so as to be dielectrically separated is then formed by grinding from the rear side of the Si substrate. Although this method produces a layer having good crystallinity, it still has problems with respect to the process of depositing polycrystalline Si having a thickness as large as several hundred microns and the process of leaving only a separate Si active layer on the substrate by grinding the rear side of the Si monocrystalline substrate, and problems involving controllability and productivity.

2. A method called SIMOX (separation by ion implanted oxygen) in which a $SiO_2$ layer is formed by implanting oxygen ions in a Si monocrystalline substrate. This method at present is the most mature process because of its good conformity with the Si process. However, it is necessary for forming the $SiO_2$ layer to implant oxygen ions in an amount of $10^{18}$ ions/cm$^2$ or more. The implantation of ions takes considerable time, and thus it cannot be said that the method has high productivity. In addition, the wafer is high in cost, and many crystal defects still remain. The $SiO_2$ layer has quality insufficient to the formation of a minority carrier device 3. A method of bonding a Si monocrystalline substrate to a separate Si monocrystalline substrate or quartz, substrate which is subjected to thermal oxidation by heat treatment or using an adhesive to form a SOI structure. In this method, it is necessary for forming a device to form a uniform thin active layer.

Namely, it is necessary to grind the Si monocrystalline substrate having a thickness of several hundred microns to a thickness on the order of one micron or less. The method therefore has many problems with respect to its productivity, controllability and uniformity. In addition, the need for two substrates causes an increase in the cost.

4. A method of forming a SOI structure by dielectric separation caused by oxidation of porous Si. In this method, an n-type Si layer is formed in an island-like shape on a surface of a p-type Si monocrystalline substrate by implanting proton ions (Imai et al., J. Crystal Growth, vol. 63, 547 (1983)) or epitaxial growth and patterning, only the p-type Si substrate is made porous by anodization in a HF solution in such a manner that the Si island on the surface is surrounded by the solution, and the n-type Si island is then dielectrically separated by enhanced oxidation. This method has the problem that the degree of freedom for design of a device is in some cases limited because the Si region separated is determined before the device process.

The thin film Si layer deposited on a glass substrate representative of light-transmitting substrates is generally an amorphous layer or, at best, a polycrystalline layer because the Si layer reflects the disorder of the crystal structure of the substrate, and no high-quality device can thus be formed by using the Si layer. This is because the substrate has an amorphous crystal structure, and the fact is that a monocrystalline layer of high quality cannot be easily obtained by simply depositing a Si layer.

The formation of a semiconductor device on a light-transmitting substrate is important for forming a contact sensor and a projection-type liquid crystal image display, which serve as light-receiving devices. In addition, a high-quality driving element is required for further increasing the density, resoltuion and fineness of pixels (picture elements) of such a sensor or display. It is consequently necessary to produce an element to be provided on a light-transmitting substrate by using a single crystal layer having excellent crystallinity.

It is therefore difficult to produce a driving element having properties sufficient for the present demands or future demands because the crystal structure of an amorphous Si or polycrystal Si has many defects.

However, any one of the methods using a Si monocrystalline substrate is unsuitable for obtaining a good monocrystalline film on a light-transmitting substrate.

In addition, since the rate of thermal oxidation of a Si monocrystal is about 1 micron per hour (wet oxidation at 1,200° C. and atmospheric pressure), several hundreds of hours are required for oxidizing a whole Si wafer having a thickness of several hundred microns and leaving the surface layer unoxidized. Further, it is known that when Si is oxidized to $SiO_2$, there is an accompanying increase in volume by 2.2 times. This sometimes causes the problem that, if a Si substrate is oxidized without any other processing, cracks or warpage may occur in the Si layer owing to the application of stress exceeding the elastic limit to the Si layer remaining on the surface.

SUMMARY OF THE INVENTION

It is an object of the present invention to provide a method of producing a semiconductor substrate which can solve the above problems and satisfy the above requirements.

It is another object of the present invention to provide a method of producing a semiconductor substrate which exhibits excellent productivity, uniformity and controllability and low cost for obtaining a Si crystalline layer having crystallinity which is not inferior to that of a monocrystalline wafer on a transparent substrate (light-transmitting substrate).

It is still another object of the present invention to provide a method of producing a semiconductor substrate which is capable of realizing and utilizing the advantages of a conventional SOI device as they are in the fields of performance and practicality and industry.

It is a further object of the present invention to provide a method of producing a semiconductor substrate which can be used in place of the above-mentioned methods of producing a substrate such as SOS or SIMOX in the production of a large scale integrated circuit having a SOI structure.

DETAILED DESCRIPTION OF THE PREFERRED EMBODIMENTS

The present method of producing a semiconductor substrate, which can attain the afore-mentioned objects of the present invention, is based on formation of a monocrystalline silicon layer on a porous silicon substrate by epitaxial growth.

Porous silicon is readily oxidized, as compared with monocrystalline silicon, and has a high oxidation rate, and thus the present invention is also based on oxidation of the entire porous silicon substrate to $SiO_2$, thereby readily obtaining a light-transmissible substrate.

However, the Si monocrystalline layer has many defects and dislocations around the interface with porous Si (in the region of a few thousand Å from the interface), and thus a thin film of Si monocrystal, even if formed on a porous Si, sometimes has a crystallinity problem. That is, in the formation of SOI structure by epitaxial growth of silicon monocrystal on porous silicon, defects readily develop particularly around the interface with $SiO_2$ in the Si thin film layer, to cause a device characteristic problem.

In the present invention, these problems are solved by forming a silicon monocrystalline layer on a porous silicon substrate by epitaxial growth and subjecting the porous silicon substrate and the monocrystalline silicon layer to an oxidation treatment in a method of producing a semiconductor substrate having a silicon monocrystalline layer on a light-transmissible substrate material.

The present invention provides a Si monocrystalline layer having considerably less defects on a light-transmissible $SiO_2$ substrate by changing both sides of a Si monocrystalline substrate, which is uniformly flat over the large area and has a distinguished crystallinity and a good economy, to $SiO_2$, while leaving a Si active layer of any desired thickness to any desired depth near the surface.

DESCRIPTION OF PREFERRED EMBODIMENTS

Preferred embodiments of a method of producing a semiconductor substrate of the present invention are described in detail below with reference to the drawings.

FIGS. 1 to 4 are respectively schematic sectional views for explaining the steps of a method of producing a semiconductor substrate of the invention.

Figure 1:
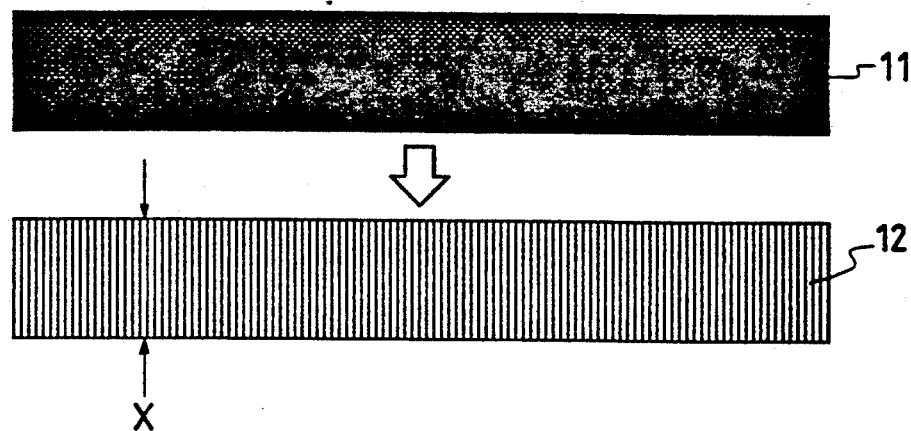
FIGS. 1 to 4 are schematic cross-sectional views for explaining steps of producing a substrate according to one of preferable embodiments of the present invention.

As shown in FIG. 1, a p-type or high density, n-type Si monocrystalline substrate 11 is changed to a substrate 12 having a porous Si layer by anodizing the back side of the substrate 11 with a HF solution. The density of the porous Si layer can be changed in a range of 1.1 to 0.6 g/cm$^3$ by changing the concentration of the HF solution for anodization to 50 to 20%, as compared with the density of monocrystalline Si, i.e. 2.33 g/cm$^3$.

Figure 2:
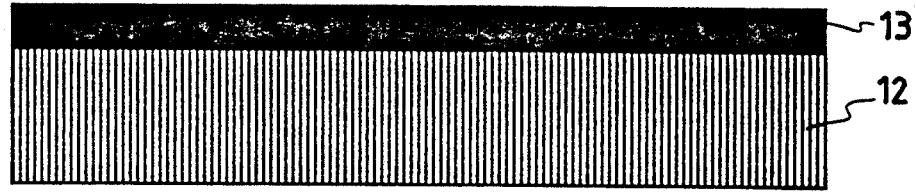

Then, as shown in FIG. 2, a monocrystalline Si layer 13 is epitaxially grown on the porous Si substrate 12.

Figure 3:
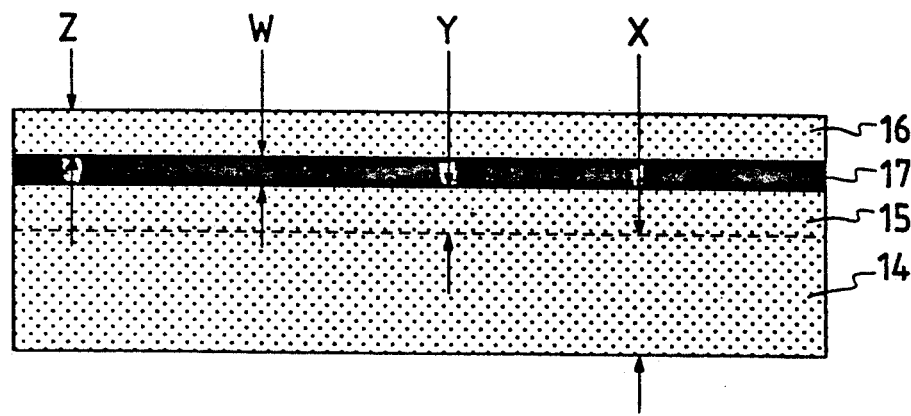

Then, as shown in FIG. 3, both of the epitaxial layer surface and the porous Si substrate surface are simultaneously oxidized without using any antioxidant film such as a silicon nitride film on the epitaxially grown surface. Oxidation from the back side (porous Si layer side) extends into the epitaxial layer, and the monocrystalline Si layer 17, which remains after the oxidation, is a thin film layer around the center of the epitaxial layer.

Figure 4:
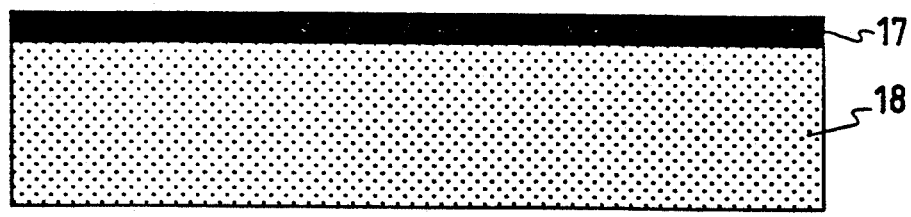
Figure 5:
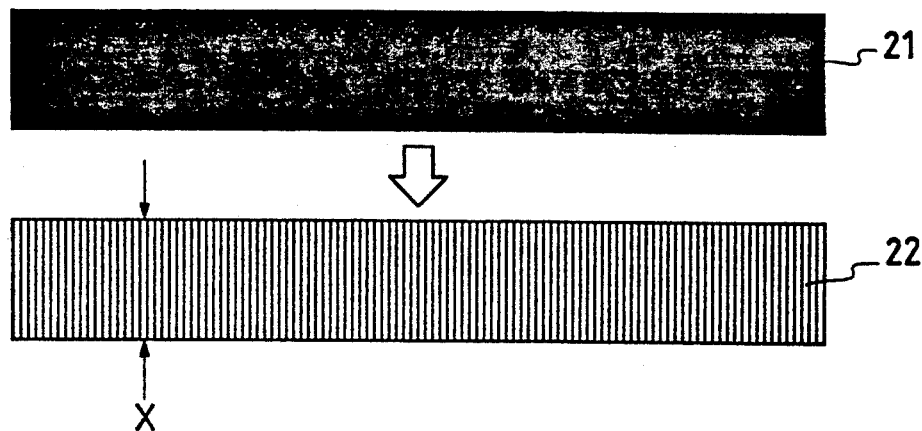
FIGS. 5 to 9 are schematic cross-sectional views for explaining steps of producing a substrate according to another preferable embodiment of the present invention.
Figure 6:
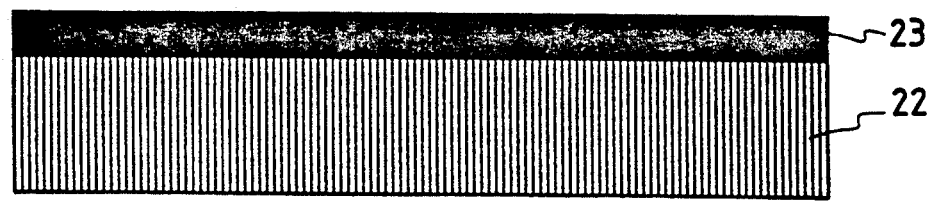

FIG. 4 shows a semiconductor substrate obtained according to the present invention. That is, a monocrystalline Si layer 17, whose crystallinity is identical with that of a Si wafer, is formed as a flat, uniformly thin film layer over the entire wafer region of large area on a SiO$_2$ light-transmissible insulating substrate 18 by removing an oxide film 16 in FIG. 3. The semiconductor substrate thus obtained can be suitably used from the viewpoint of preparing electronic devices dielectrically separated on a light-transmissible substrate.

Although the Si porous layer has a density which is half or less than that of a Si monocrystal, as described above, monocrystallinity is maintained, and a Si monocrystalline layer can be formed on the porous layer by epitaxial growth. However, since the characteristic of enhanced oxidation is lost due to the rearrangement of the inner holes at 1,000° C. or more, it is necessary to ensure that the temperature of formation of a monocrystal is not higher than the required temperature.

Porous Si was discovered in the course of research on electropolishing of a semiconductor which was conducted by Uhlir et al. in 1956 (A. Uhlir, Bell Syst. Tech. J., vol. 35, p. 333 (1956)).

Unagami et al. investigated the Si dissolution reaction during anodization and reported that the anodic reaction of Si in a HF solution requires holes, and that the reaction is expressed as follows (T. Unagami: J. Electrochem. Soc., vol. 127, p. 476 (1980)):

$$Si + 2HF + (2-n)e^+ \rightarrow SiF_2 + 2H^+ + ne^-$$

$$SiF_2 + 2HF \rightarrow SiF_4 + H_2$$

$$SiF_4 + 2HF \rightarrow H_2SiF_6$$

or $$Si + 4HF + (4-\lambda)e^+ \rightarrow SiF_4 + 4H^+ + \lambda e^-$$

$$SiF_4 + 2HF \rightarrow H_2SiF_6$$

wherein e$^+$ and e$^-$ respectively denote a hole and an electron, and n and λ each denotes the number of holes required for dissolving one silicon atom. Porous Si can be formed when the condition, n>2 or λ>4, is satisfied.

The process of making silicon porous has been proved by Imai (Nagano, Nakajima, Yasuno, Ohnaka, Kajiwara, Technical Research Report of the Institute of Electronics and Communication Engineers of Japan, vol 79, SSD 79-9549 (1979) and K. Imai, Solid-State Electronics vol. 24, 159 (1981)).

It is also reported that high density, n-type Si can be made porous (R. P. Holmstrom and J. Y. Chi, Appl. Phys. Lett., vol. 42, 386 (1983)).

In addition, because the porous layer has large quantities of voids formed therein, the density thereof is reduced to half or less. Since the surface area is consequently significantly increased, as compared with the volume, the oxidation rate is increased by a hundred times or more, as compared with the oxidation rate of a usual monocrystalline layer (H. Takai, T. Itoh, J. Appl. Phys., Vol. 60, No. 1, p. 222 (1986)).

Namely, as described above, since the oxidation rate at 1,200° C. of the Si monocrystalline substrate is about 1 micron per hour, the oxidation rate of the porous Si reaches about 100 microns per hour, and oxidation of the whole of a wafer having a thickness of several hundred microns can be put into practical use. In addition, the oxidation time can be further reduced by employing the oxidation rate increasing phenomenon during oxidation under pressure higher than the atmospheric pressure (N. Tsubouchi, H. Miyoshi, A. Nishimoto and H. Abe, Japan J. Appl. Phys., Vol. 16, No. 5, 855 (1977)).

The porous Si layer formed by the above-described process has holes having an average size of about 600 Å which were measured by observation using a transmission electron microscope. Although the porous Si layer has a density which is half or less than that of a monocrystalline Si, as described above, monocrystallinity is maintained, and a monocrystalline layer 13 can be formed on the porous layer by epitaxial growth. However, since the characteristic of enhanced oxidation is lost due to the rearrangement of the inner holes at 1,000° C. or more. Thus, a crystal growth procedure capable of conducting a low temperature growth such as molecular beam epitaxial growth, plasma CVD, photo CVD, bias sputtering, etc. is required for the epitaxial growth of Si layer. The thickness of monocrystalline Si layer 13 to be formed is preferably not more than 50 μm. Above 50 μm, the afore-mentioned advantages obtainable by the SOI technique may be lost.

When a Si monocrystalline layer is formed on a porous Si and the Si monocrystalline layer has many defects and dislocations around the interface with porous Si (in the region of a few thousand Å from the interface), a thin film of Si monocrystal, even if formed on a porous Si, sometimes has a crystallinity problem. That is, in the formation of SOI structure by epitaxial growth of silicon monocrystal on a porous silicon, defects readily develop particularly around the interface with SiO$_2$ in the Si thin film layer cause a device characeristic problem. However, the defects that remain in the deep region of the epitaxial layer can be reduced in SiO$_2$ by the oxidation of the back side, and thus deterioration of device characteristics due to the presence of defects can be prevented. Furthermore, the absence of an antioxidant film on the epitaxial layer surface can shorten the time of making monocrystalline Si into a thin film. Furthermore, since time dependency of the thickness of silicon oxide film formed from the monocrystalline Si and the porous Si is known, it is possible to form a monocrystalline Si thin film of any desired thickness at any desired depth in the epitaxial layer and select a layer with less defects by changing the thickness of epitaxial layer and oxidation time and oxidation conditions.

Although the volume of a Si monocrystal is increased by 2.2 times by oxidation, the increase in volume can be controlled or suppressed by controlling the density of the porous Si so that the occurrence of warpage of a semiconductor substrate or the occurrence of a crack in a monocrystalline layer provided on the surface of the substrate can be avoided during the oxidation process.

The volume ratio R of Si monocrystal to porous Si after oxidation can be expressed as follows:

$$R = 2.2 \times (A/2.33)$$

wherein A denotes the density of porous Si.

When it is desired that $R=1$, i.e., that there is no increase in volume after oxidation, A in the above formula may be 1.06 (g/cm$^2$). Namely, if the density of the porous layer is 1.06, an increase in volume, which is caused by oxidation, can be suppressed.

As shown in FIG. 3, let the thickness of porous oxidized Si 14 be X microns, the thickness of oxidized film 15 (or thickness to be oxidized) from the bottom of the epitaxial layer be Y microns, the thickness of oxidized film 16 (thickness to be oxidized) from the top of the epitaxial layer be Z microns, and the thickness of ultimately remaining monocrystalline Si thin film 17 be W microns. Let time until the entire porous Si is oxidized be $t_1$, and time required for the entire oxidation process be $t_2$. Suppose that the porous Si has a density that undergoes no volume increase by successive oxidation, i.e. 1.06 g/cm$^3$, and 2.2-fold volume increase occurs in the film thickness direction by the oxidation of the epitaxial layer. Thus, the thickness of initially grown epitaxial layer, V microns, can be represented by the following equation:

$$V = W + (Y+Z)/2.2$$

In case of oxidation of porous Si, different from the ordinary oxidation of monocrystalline Si, the oxidizing atmosphere enters into the pores, and thus the oxidation rate, $R_{ox}$ microns/time, will be constant.

$$X = R_{ox} \cdot t_1$$

Relation between the oxidation time t and oxidized film thickness T in the oxidation of monocrystalline Si can be given by the following equation:

$$T^2 + AT = Bt$$

A: linear rate constant
B: parabolic rate constant

Oxidation process from the back side of the epitaxial layer can be given by the following equation, on the assumption that the back side of the epitaxial layer is directly exposed to the oxidizing atmosphere:

$$Y^2 + AY = B(t_2 - t_1)$$

Oxidation process from the surface side of the epitaxial layer can be given by the following equation:

$$Z^2 + AZ = Bt_2$$

From these equations, the thickness V of the epitaxial layer and the entire oxidation time $t_2$ can be derived as follows:

$$V = W + (2Y - A + \sqrt{D})/4.4$$

$$D = A^2 + 4BX/R_{ox} + rY(A+Y)$$

$$t_2 = X/R_{ox} + (Y^2 + AY)/B$$

By giving the thickness of porous Si, that is, thickness of Si wafer, X microns, thickness of ultimate SOI layer, W microns, and thickness of epitaxial layer bottom to be oxidized due to many defects, Y/2.2 microns, the thickness of epitaxial layer can be determined in advance, and a SOI layer of desired thickness with less defects can be obtained.

Another embodiment of the present invention will be given below.

Figure 7:
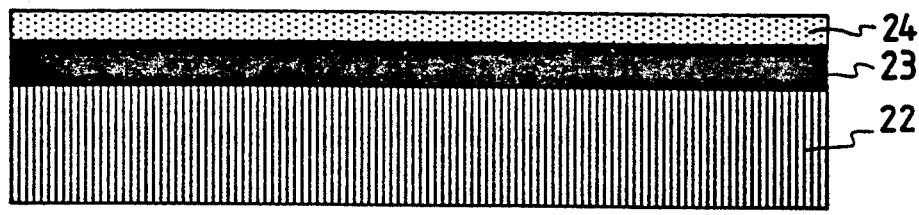

FIGS. 5 to 9 are respectively schematic cross-sectional views for explaining steps of a method of producing a semiconductor substrate according to another embodiment of the present invention, where an antioxidant film is provided on the surface of an epitaxial layer. That is, both of the upper side and lower side of the epitaxial layer are not oxidized. As shown in FIG. 7, a silicon nitride (Si$_3$N$_4$) layer 24 is deposited as an antioxidant film on the surface of the epitaxial layer, and the whole of porous Si substrate 22 and a portion of the epitaxial layer 23 are oxidized to SiO$_2$ to prepare a light transmissible, insulating substrate material 28. A thin SiO$_2$ layer may be provided as a buffer layer to prevent occurrence of defects due to strains among the epitaxial layer surface, the antioxidant film and the Si$_3$N$_4$ layer 24.

Provision of an antioxidant film correspondingly increases the treating time, but has such an advantage as to make the deposited epitaxial layer thinner.

In that case, $Z = 0$, and thus the following equations can be obtained:

$$V = W + Y/2.2$$

$$X = R_{ox} \cdot t_1$$

$$Y^2 + AY = B(t_2 - t_1)$$

From these equations, thickness of epitaxial layer V and the entire oxidation time $t_2$ be derived as follows:

$$V = W + Y/2.2$$

$$t_2 = X/R_{ox} + (Y^2 + AY)/B$$

By giving the thickness of porous Si, that is, thickness of Si wafer, X microns, thickness of ultimate SOI layer, W microns, and thickness of epitaxial layer lower side to be oxidized due to many defects, Y/2.2 microns, the thickness of epitaxial layer can be determined in advance, and a SOI layer of desired thickness with less defects can be obtained.

Figure 9:
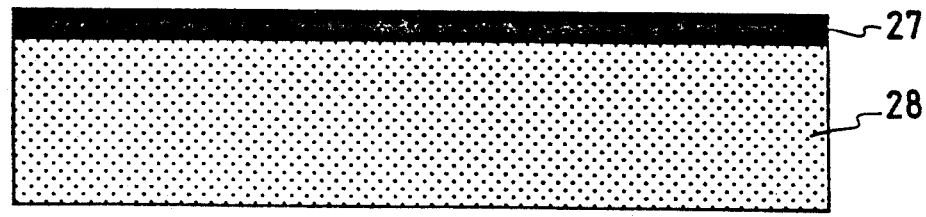

FIG. 9 shows a semiconductor substrate obtained according to the present invention.

Figure 8:
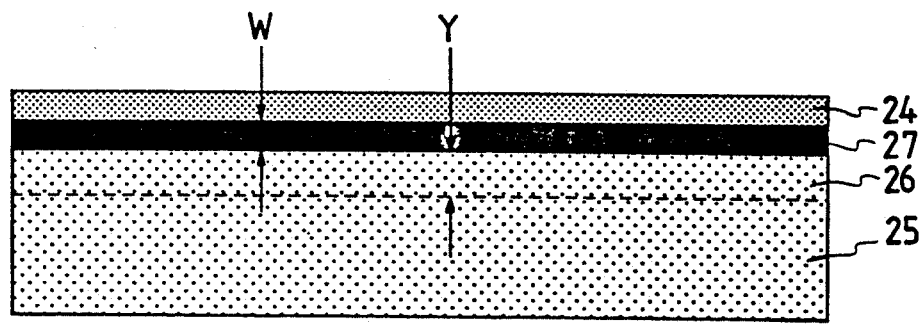

By removing the antioxidant film 24 in FIG. 8, the present invention thus enables the formation of a semiconductor substrate comprising the SiO$_2$ light-transmitting insulating substrate material 28 and the Si monocrystalline layer 27 which has the same degree of crystallinity as that of a silicon wafer and which is flatly and uniformly formed in a thin layer over a large area.

The thus-formed semiconductor substrate can be preferably used for producing an electronic device dielectrically separated on a light-transmitting substrate.

Preferable conditions for the porous formation are a current density of not more than 300 mA/cm$^2$, a concentration of HF solution of 5 to 50%, and a temperature of HF solution of 5° to 70° C.

Preferable conditions for the oxidation are dry or wet oxidation at a temperature of 800° C. or higher.

The present invention will be described in detail below, referring to Examples, which are not limitative of the present invention.

EXAMPLE 1

A high density, n-type (100) monocrystalline Si substrate 11 having a thickness of 200 microns was anodized in a 50% HF solution at a current density of 100 mA/cm$^2$. At that time a pore formation rate was found to be 8.4 μm/min. and the entire (100) Si substrate 11 having the thickness of 200 microns was made porous within 24 minutes, and a (100) porous Si substrate 12 was obtained.

A Si epitaxial layer 13 was formed on the (100) porous Si substrate 12 by a low temperature growth procedure, i.e. MBE (molecular beam epitaxy) under the following deposition conditions:

Temperature: 700° C.
Pressure: 1×10$^{-9}$ Torr
Growth rate: 0.1 nm/sec

The thickness of the epitaxial layer was determined in the following manner:

The porous Si layer was oxidized by successive wet oxidation at 1,200° C., and further the region 15 containing many defects in the epitaxial layer 13, 0.3 microns deep from the interface, was oxidized, while leaving a monocrystalline Si thin film 17 having a thickness of 0.1 microns. Heat oxidation rate of ordinary Si monocrystal is about 1 micron/hour at 1,200° C. by wet oxidation under the atmospheric pressure, whereas the oxidation rate of the porous layer was found to be about 100 times as high as the heat oxidation rate of ordinary Si monocrystal. In that case, the conditions were as follows:

$R_{ox}$=100 μm/h
A=0.05 μm
B=0.72 μm$^2$/h
X=200 μm
Y/2.2=0.3 μm
W=0.1 μm

Thickness of the epitaxial layer V and the oxidation time $t_2$ are as follows:

V=1.02 μm
$t_2$=2.65 h

That is, after the epitaxial layer was grown to the thickness of 1.02 microns, wet oxidation was conducted at 1,200° C. for 2 hours 39 minutes.

By removing the upper SiO$_2$ layer 16 by ordinary RIE, a semiconductor substrate having a 0.1 μm-thick, monocrystalline Si layer 17 was formed on the upper side of the transparent SiO$_2$ substrate 18.

As a result of observing the sectional surface using a transmission electronic microscope, it was confirmed that no crystal defect was newly introduced into the Si layer 17, and good crystallinity was maintained.

EXAMPLE 2

A p-type (100) monocrystalline Si substrate having a thickness of 200 microns was anodized in HF solution at a current density of 100 mA/cm$^2$. At that time the pore formation rate was found to be 8.4 μm/min., and the entire (100) Si substrate 11 having the thickness of 200 microns was made porous within 24 minutes and a (100) porous Si substrate was obtained. A Si epitaxial layer 13 was formed on the (100) porous Si substrate by a low temperature growth procedure, i.e. a plasma CVD under the following deposition conditions:

Gas: SiH$_4$
High frequency power: 100 W
Temperature: 800° C.
Pressure:1×10$^{-2}$ Torr
Growth rate: 2.5 nm/sec The thickness of the epitaxial layer was determined in the following manner:

The porous Si layer was oxidized by successive wet oxidation at 1,200° C. and further the region 15 containing many defects in the epitaxial layer 13, 0.3 microns deep from the interface, was oxidized, while leaving a monocrystalline Si thin film 17 having a thickness of 0.1 micron. Heat oxidation rate of ordinary Si monocrystal is about 1 μm/hour at 1,200° C. by wet oxidation under the atmospheric pressure, whereas the oxidation rate of the porous layer was found to be about 100 times as high as the heat oxidation rate of ordinary Si monocrystal. In that case, the conditions were as follows:

$R_{ox}$=100 μm/h
A=0.05 μm
B=0.72 μm$^2$/h
X=200 μm
Y/2.2=0.3 μm
W=0.1 μm

The thickness of the epitaxial layer V and the oxidation time $t_2$ were determined as follows:

V=1.02 μm
$t_2$=2.65 hours

After the epitaxial layer 13 was grown to the thickness of 1.02 microns, wet oxidation was conducted at 1,200° C. for 2 hours 39 minutes.

By removing the upper SiO$_2$ layer 16 by ordinary RIE, a semiconductor substrate having a 0.1 μm-thick monocrystalline Si layer 17 was formed on the upper side of the transparent SiO$_2$ substrate 18.

As a result of observing the sectional surface using a transmission electronic microscope, it was confirmed that no crystal defect was newly introduced into the Si layer 17, and good crystallinity was maintained.

EXAMPLE 3

A p-type (100) monocrystalline Si substrate having a thickness of 200 microns was anodized in a 50% HF solution at a current density of 100 mA/cm$^2$. At that time, the pore formation rate was found to be 8.4 μm/min. and the entire (100) Si substrate 11 having the thickness of 200 microns was made porous within 24 minutes, and a (100) porous Si substrate was obtained. A Si epitaxial layer 13 was formed on the (100) porous Si substrate 12 by a low temperature growth procedure, i.e. MBE under the following deposition conditions:

Temperature: 700° C.
Pressure: 1×10$^{-9}$ Torr
Growth rate: 0.1 nm/sec

The thickness of the epitaxial layer 13 was determined as follows:

The porous Si substrate 12 was oxidized by successive wet oxidation at 1,200° C. under elevated pressure and the region 15 containing many defects in the epitaxial layer 13, 0.3 microns deep from the interface, was oxidized, while leaving a 0.1 μm-thick monocrystalline Si thin film. Heat oxidation rate of ordinary Si monocrystal is about 1 micron/hour by wet oxidation at 1,200° C. under the atmospheric pressure, whereas the oxidation rate of the porous layer was found to be about 100 times as high as the heat oxidation rate of ordinary Si monocrystal. Furthermore, oxidation was conducted under elevated pressure to shorten the oxidation time. By wet oxidation at 1,200° C. under an elevated pressure of 6.57 kg/cm², a 5-fold oxidation rate was obtained. In that case, the conditions were as follows:

$R_{ox} = 500$ μm/h
$A = 8.08 \times 10^{-2}$ μm
$B = 3.456$ μm²/h
$X = 200$ μm
$Y/2.2 = 0.3$ μm
$W = 0.1$ μm The thickness of the epitaxial layer V and the oxidation time $t_2$ were as follows:

$V = 1$ μm
$t_2 = 0.54$ hours

That is, after the epitaxial layer was grown to the thickness of 1 micron, wet oxidation was conducted at 1,200° C. for 32 minutes 30 seconds.

By removing the upper $SiO_2$ layer by ordinary RIE, a monocrystalline Si layer 17 having a thickness of 0.1 μm was formed on the upper side of the transparent $SiO_2$ substrate 18. As a result of observing the sectional surface using a transmission electronic microscope, it was confirmed that no crystal defect was newly introduced into the Si layer 17, and good crystallinity was maintained.

EXAMPLE 4

A p-type, or high density n-type (100) monocrystalline Si substrate having a thickness of 200 microns was anodized in a 50% HF solution at a current density of 100 mA/cm². At that time, the pore formation rate was found to be 8.4 μm/min. and the entire (100) Si substrate having the thickness of 200 microns was made porous within 24 minutes. A Si epitaxial layer was formed on the (100) porous Si substrate by a low temperature growth procedure, i.e. plasma CVD under the following deposition conditions:

Gas: $SiH_4$
High frequency power: 100 W
Temperature: 800° C.
Pressure: $1 \times 10^{-2}$ Torr
Growth rate: 2.5 nm/sec The thickness of the epitaxial layer was determined as follows:

The porous Si was oxidized by successive wet oxidation at 1,200° C. under elevated pressure and the region containing many defects in the epitaxial layer, 0.3 microns deep from the interface, was oxidized, while leaving a 0.1 μm-thick monocrystalline Si thin film. Heat oxidation rate of ordinary Si monocrystal is about 1 micron/hour by wet oxidation at 1,200° C. under the atmospheric pressure, whereas the oxidation rate of the porous layer was found to be about 100 times as high as the heat oxidation rate of ordinary Si monocrystal. Furthermore, oxidation was carried out under elevated pressure to shorten the oxidation time. By conducting wet oxidation at 1,200° C. under an elevated pressure of 6.57 kg/cm², a 5-fold oxidation rate was obtained. In that case, the conditions were as follows:

$R_{ox} = 500$ μm/h
$A = 8.08 \times 10^{-2}$ μm
$B = 3.456$ μm²/h
$X = 200$ μm
$Y/2.2 = 0.3$ μm
$W = 0.1$ μm The thickness of the epitaxial layer V and the oxidation time $t_2$ were determined as follows:

$V = 1$ μm
$t_2 = 0.54$ hours

That is, after the epitaxial layer was grown to the thickness of 1 micron, wet oxidation was conducted at 1,200° C. for 32 minutes 30 seconds.

By removing the upper $SiO_2$ layer by ordinary RIE, a monocrystalline Si layer having a thickness of 0.1 μm was formed on the upper side of the transparent $SiO_2$ substrate.

As a result of observing the sectional surface using a transmission electronic microscope, it was confirmed that no crystal defect was newly introduced into the Si layer, and good crystallinity was maintained.

EXAMPLE 5

A p-type, or high density n-type (100) monocrystalline Si substrate having a thickness of microns was anodized in a 50% HF solution at a current density of 100 mA/cm². At that time, the pore formation rate was found to be 8.4 μm/min. and the entire (100) Si substrate having the thickness of microns was made porous within 24 minutes.

A Si epitaxial layer was formed on the (100) porous Si substrate by a low temperature growth procedure, i.e. MBE (molecular beam epitaxy) under the following deposition conditions:

Temperature: 700° C.
Pressure: $1 \times 10^{-9}$ Torr
Growth rate: 0.1 nm/sec

The thickness of the epitaxial layer was determined as follows:

The porous Si was oxidized by successive wet oxidation at 1,200° C. and further the region containing many defects in the epitaxial layer, 0.3 microns deep from the interface, was oxidized without oxidizing the surface of the epitaxial layer, while leaving a 0.1 μm-thick monocrystalline Si thin film. Heat oxidation rate of ordinary Si monocrystal is about 1 micron/hour by wet oxidation at 1,200° C. under the atmospheric pressure, whereas the oxidation rate of of the porous layer was found to be about 100 times as high as the heat oxidation rate of ordinary Si monocrystal. In that case, the conditions were as follows:

$R_{ox} = 100$ μm/h
$A = 0.05$ μm
$B = 0.72$ μm²/h
$X = 200$ μm
$Y/2.2 = 0.3$ μm
$W = 0.1$ μm

The thickness of the epitaxial layer V and the oxidation time $t_2$ were determined as follows:

$V = 0.4$ μm
$t_2 = 2.65$ hours

That is, after the epitaxial layer was grown to the thickness of 0.4 microns, $Si_3N_4$ was deposited to a thickness of 0.1 μm on the surface of the epitaxial layer as an antioxidant film, and then wet oxidation was carried out at 1,200° C. for 2 hours 39 minutes.

By removing the upper $Si_3N_4$ layer by ordinary RIE, a monocrystalline Si layer having a thickness of 0.1 μm was formed on the upper side of the transparent $SiO_2$ substrate.

As a result of observing the sectional surface using a transmission electronic microscope, it was confirmed that no crystal defect was newly introduced into the Si layer, and good crystallinity was maintained.

EXAMPLE 6

A p-type or high density n-type (100) monocrystalline Si substrate having a thickness of 200 microns was anodized in a 50% HF solution at a current density of 100 mA/cm². At that time, the pore formation rate was found to be 8.4 μm/min., and the entire (100) Si substrate having the thickness of microns was made porous within 24 minutes. A Si epitaxial layer was formed on the (100) porous Si substrate by a low temperature growth procedure, i.e. plasma CVD under the following deposition conditions:

Gas: $SiH_4$
High frequency power: 100 W
Temperature: 800° C.
Pressure: $1 \times 10^{-2}$ Torr
Growth rate: 2.5 nm/sec The thickness of the epitaxial layer was determined as follows:

The porous Si was oxidized by successive wet oxidation at 1,200° C. and the region containing many defects in the epitaxial layer, 0.3 microns from the interface, was oxidized without oxidizing the surface of the epitaxial layer, while leaving a 0.1 μm-thick monocrystalline Si thin film. Heat oxidation rate of ordinary Si monocrystal is about 1 micron/hour by wet oxidation at 1,200° C. under the atmospheric pressure, whereas the oxidation rate of the porous layer was found to be about 100 times as high as the heat oxidation rate of ordinary Si monocrystal. In that case, the conditions were as follows:

$R_{ox}$ = 100 μm/h
A = 0.05 μm
B = 0.72 μm²/h
X = 200 μm
Y/2.2 = 0.3 μm
W = 0.1 μm

The thickness of the epitaxial layer V and the oxidation time $t_2$ were determined as follows:

V = 0.4 μm
$t_2$ = 2.65 hours

That is, after the epitaxial layer was grown to the thickness of 0.4 microns, $Si_3N_4$ was deposited to a thickness of 0.1 μm on the surface of the epitaxial layer as an antioxidant film, and then wet oxidation was conducted at 1,200° C. for 2 hours 39 minutes.

By removing the upper $Si_3N_4$ layer by ordinary RIE, a monocrystalline Si layer having a thickness of 0.1 μm was formed on the upper side of the transparent $SiO_2$ substrate.

As a result of observing the sectional surface using a transmission electronic microscope, it was confirmed that no crystal defect was newly introduced into the Si layer, and good crystallinity was maintained.

EXAMPLE 7

A p-type or high density n-type (100) monocrystalline Si substrate having a thickness of 200 microns was anodized in a 50% HF solution at a current density of 100 mA/cm². At that time, the pore formation rate was found to be 8.4 μm/min., and the entire (100) Si substrate having the thickness of 200 microns was made porous within 24 minutes. A Si epitaxial layer was formed on the (100) porous Si substrate by a low temperature growth procedure, i.e. MBE under the following deposition conditions:

Temperature: 700° C.
Pressure: $1 \times 10^{-9}$ Torr
Growth rate: 0.1 nm/sec

The thickness of the epitaxial layer was determined as follows:

The porous Si was oxidized by successive wet oxidation at 1,200° C. under elevated pressure, and the region containing many defects in the epitaxial layer, 0.3 microns from the interface, was oxidized without oxidizing the surface of the epitaxial layer, while leaving a 0.1 μm-thick monocrystalline monocrystal is about 1 micron/hour by wet oxidation at 1,200° C. under the atmospheric pressure, whereas the oxidation rate of the porous layer was found to be about 100 times as high as the heat oxidation rate of ordinary Si monocrystal. Furthermore, oxidation was carried out under elevated pressure to shorten the oxidation time. A 5-fold oxidation rate was obtained by wet oxidation at 1,200° C. under an elevated pressure of 6.57 kg/cm². In that case, the conditions were as follows:

$R_{ox}$ = 500 μm/h
A = $8.08 \times 10^{-2}$ μm
B = 3.456 μm²/h
X = 200 μm
Y/2.2 = 0.3 μm
W = 0.1 μm The thickness of the epitaxial layer V and the oxidation time $t_2$ were determined as follows:

V = 0.4 μm
$t_2$ = 0.54 hours

That is, after the epitaxial layer was grown to a thickness of 0.4 microns, $Si_3N_4$ was deposited to a thickness of 0.1 μm on the surface of the epitaxial layer as an antioxidant film and then wet oxidation was carried out at 1,200° C. for 32 minutes 30 seconds.

By removing the upper $Si_3N_4$ layer by ordinary RIE, a 0.1 μm-thick monocrystalline Si layer was formed on the upper side of the transparent $SiO_2$ substrate.

As a result of observing the sectional surface using a transmission electronic microscope, it was confirmed that no crystal defect was newly introduced into the Si layer, and good crystallinity was maintained.

EXAMPLE 8

A p-type or a high density n-type (100) monocrystalline Si substrate having a thickness of microns was anodized in a 50% HF solution at a current density of 100 mA/cm². At that time, the pore formation rate was found to be 8.4 μm/min., and the entire (100) Si substrate having the thickness of 200 microns was made porous within 24 minutes. A Si epitaxial layer was formed on the (100) porous Si substrate by a low temperature growth procedure, i.e. plasma CVD under the following conditions:

Gas: $SiH_4$

High frequency power: 100 W
Temperature: 800° C.
Pressure: $1 \times 10^{-2}$ Torr
Growth rate: 2.5 nm/sec The thickness of the epitaxial layer was determined as follows:

The porous Si was oxidized by successive wet oxidation at 1,200° C. under elevated pressure, and the region containing many defects in the epitaxial layer, 0.3 microns from the interface, was oxidized without oxidizing the surface of the epitaxial layer, while leaving a 0.1 μm-thick monocrystalline Si thin film. Heat oxidation rate of ordinary Si monocrystal is about 1 micron/hour, whereas the oxidation rate of the porous layer by wet oxidation at 1,200° C. under the atmospheric pressure was about 100 times as high as the heat oxidation rate of ordinary Si monocrystal. Furthermore, oxidation was carried out under elevated pressure to shorten the oxidation time. A 5-fold oxidation rate was obtained by wet oxidation at 1,200° C. under an elevated pressure of 6.57 kg/cm². In that case, the conditions were as follows:

$R_{ox} = 500$ μm/h
$A = 8.08 \times 10^{-2}$ μm
$B = 3.456$ μm²/h
$X = 200$ μm
$Y/2.2 = 0.3$ μm
$W = 0.1$ μm The thickness of the epitaxial layer V and the oxidation time $t_2$ were determined as follows:

$V = 0.4$ μm
$t_2 = 0.54$ hours

That is, after the epitaxial layer was grown to a thickness of 0.4 microns, $Si_3N_4$ was deposited to a thickness of 0.1 μm on the surface of the epitaxial layer as an antioxidant layer and then wet oxidation was carried out at 1,200° C. for 32 minutes 30 seconds.

By removing the upper $Si_3N_4$ layer by ordinary RIE, a monocrystalline Si layer having a thickness of 0.1 μm was formed on the upper side of the transparent $SiO_2$ substrate.

As a result of observing the sectional surface using a transmission electronic microscope, it was confirmed that no crystal defect was newly introduced into the Si layer, and good crystallinity was maintained.

As explained in detail above, the present invention provides a method of producing a semiconductor substrate which is free from the afore-mentioned problems and can satisfy the aforementioned requirements.

The present invention further provides a distinguished method with respect to productivity, uniformity, controllability and economy in the production of a Si crystalline layer, whose crystallinity is equivalent with that of monocrystalline wafer, on a transparent substrate material, i.e. light-transmissible substrate material.

The present invention still furthermore provides a method of producing a practically applicable semiconductor substrate with advantages of conventional SOI devices.

The present invention still furthermore provides a method of producing a semiconductor substrate, which can serve as a substitute for SOS or SIMOX in the production of large-scale integrated circuit of SOI structure.

The present invention still furthermore provides a method of forming a good monocrystalline Si thin film on a light-transmissible substrate material with effective reduction of defects in the monocrystalline layer.

The present invention provides a semiconductor substrate having a monocrystalline Si layer having a good crystallinity on a light-transmissible substrate material.

According to the present invention, the lower side of a Si substrate and the region containing many defects in the epitaxial layer are changed to transparent $SiO_2$ while leaving a monocrystalline layer only on the surface by utilizing an originally good quality monocrystalline Si substrate as a starting material, and a number of treatments can be carried out in a short time, as described in detail in the Examples. In the present invention, considerable progress can be obtained in the productivity and economy.

What is claimed is:

1. A method of producing a semiconductor substrate, which comprises forming a monocrystalline silicon layer on a porous silicon substrate by epitaxial growth and applying an oxidation treatment to the porous silicon substrate and the part of the monocrystalline silicon layer adjacent the interface between the porous silicon substrate and the monocrystalline silicon layer.

2. A method according to claim 1, wherein the silicon substrate is of p-type or n-type.

3. A method according to claim 1, wherein the monocrystalline silicon layer formed on the substrate has a thickness of not more than 50 microns.

4. A method according to claim 1, wherein the oxidation includes heating in an oxygen-containing atmosphere.

5. A method according to claim 4, wherein the oxidation is carried out under a higher pressure than the atmospheric pressure.

6. A method according to claim 1, wherein the monocrystalline silicon layer is formed by molecular beam epitaxy, plasma CVD, photo CVD or bias sputtering.

7. A method according to claim 1, wherein the porous silicon substrate is formed by anodization.

8. A method according to claim 7, wherein the anodization is carried out in a HF solution.

9. A method according to claim 1, wherein an antioxidant film is formed on the monocrystalline silicon layer before the oxidation.

10. A method according to claim 9, wherein the antioxidant film is a silicon nitride film.

11. A method according to claim 1, wherein the opposite side of the monocrystalline silicon to the porous silicon substrate is oxidized by the oxidation.

* * * * *

UNITED STATES PATENT AND TRADEMARK OFFICE
CERTIFICATE OF CORRECTION

PATENT NO. : 5,258,322
DATED : November 2, 1993
INVENTOR(S) : KIYOFUMI SAKAGUCHI, ET AL.

It is certified that error appears in the above-identified patent and that said Letters Patent is hereby corrected as shown below:

ON TITLE PAGE

In [56] References Cited, under OTHER PUBLICATIONS:
"Wolf, S.," should read --Wolf, S. et al.,--.

COLUMN 2

Line 62, "device" should read --device.--.

COLUMN 6

Line 41, "since" should be deleted.
Line 60, "cause a device characteristic" should read
--thereby causing a characteristic device--.

COLUMN 8

Line 9, "$D=A^2+4BX/R_{ox}+rY(A+Y)$" should read
--$D=A^2+4BX/R_{ox}+4Y(A+Y)$--.

COLUMN 10

Line 3, "substrate" should read --substrate 11--.

COLUMN 12

Line 29, "microns" should read --200 microns--.
Line 33, "microns" should read --200 microns--.

COLUMN 13

Line 20, "microns" should read --200 microns--.

UNITED STATES PATENT AND TRADEMARK OFFICE
CERTIFICATE OF CORRECTION

PATENT NO.  : 5,258,322
DATED       : November 2, 1993
INVENTOR(S) : KIYOFUMI SAKAGUCHI, ET AL.    Page 2 of 2

It is certified that error appears in the above-identified patent and that said Letters Patent is hereby corrected as shown below:

COLUMN 14

Line 59, "microns" should read --200 microns--.

COLUMN 15

Line 50, "aforementioned" should read --afore-mentioned--.

COLUMN 16

Line 57, "silicon" should read --silicon layer--.

Signed and Sealed this

Nineteenth Day of July, 1994

Attest:

BRUCE LEHMAN

Attesting Officer    Commissioner of Patents and Trademarks